(12) United States Patent
Lin et al.

(10) Patent No.: US 6,271,086 B1
(45) Date of Patent: Aug. 7, 2001

(54) METHOD FOR PREVENTING THE CLUSTER DEFECT OF HSG

(75) Inventors: Kuo-Chi Lin, Lu-Chou; Da-Wen Hsia, Taipei; Cheng-Chiech Huang, Tu-Cheng, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/343,846

(22) Filed: Jun. 30, 1999

(51) Int. Cl.$^7$ .................................................. H01L 21/8242
(52) U.S. Cl. ........................ 438/255; 438/253; 438/396; 438/964
(58) Field of Search ........................... 438/253, 255, 438/396, 398, 397, 254, 964

(56) References Cited

U.S. PATENT DOCUMENTS

| | | | |
|---|---|---|---|
| 5,721,153 | * | 2/1998 | Kim et al. .............................. 438/398 |
| 5,930,625 | * | 6/1999 | Lin et al. .............................. 438/253 |
| 5,981,351 | * | 6/1999 | Nam et al. ............................ 438/398 |
| 6,087,226 | * | 7/2000 | Kim et al. ............................. 438/275 |

\* cited by examiner

*Primary Examiner*—Chandra Chaudhari
*Assistant Examiner*—Yennhu B. Huynh

(57) ABSTRACT

A method for preventing the cluster defect of HSG is disclosed. Where the cluster defect means that when wafer with HSGs are cleaned just when HSGs are formed, there are a plurality of clusters appear on HSGs. In comparison with conventional fabrication that wafer and HSGs are directly cleaned just when these HSGs are formed. The idea behind the invention is that when HSGs are formed, a heat treatment is applied to change surface states of HSGs before wafer and HSGs are cleaned. Owing to the fact that these surface states of HSGs are improved by the heat treatment, no cluster will be formed during following clean process. Thus, the formation of cluster is obviously protected and then quality of any application of HSGs is improved by the invention.

19 Claims, 4 Drawing Sheets

METHOD FOR PREVENTING THE CLUSTER DEFECT OF HSG

BACKGROUND OF THE INVENTION

1. Field of the Invention

The present invention relates to the improvement of HSG (Hemispherical silicon grain), and more specifically relates to preventing the cluster defect of HSG by heat treatment.

2. Description of the Prior Art

HSG is broadly applied in contemporary semiconductor fabrication. The most famous application of HSG is forming HSGs on surface of bottom electrode of capacitor to efficiently increase total surface area of electrode of capacitor.

In addition, in most of applications of HSG, when HSGs (Hemispherical Silicon Grains) are formed on a wafer, then wafer with HSGs are directly cleaned before any following fabrication such as deposition of dielectric layer. For example, when HSGs are used to increase surface area of electrode of capacitor, HSGs are pre-cleaned before formation of dielectric layer. Herein, cleaning process is used to wipe out any impurity on the wafer and is more especially to wipe out any impurity on HSGs. No matter how, an obvious defect is found that during cleaning process a plurality of clusters appear on surface of HSGs. In other words, parts of HSGs are covered by these clusters and then yield of following fabrication is decreased by these clusters. No matter how, mechanism of formation of clusters still is an unsolved question, and a main component of these clusters is silicon.

FIG. 1A to FIG. 1C are some qualitative illustrations show how formation of HSG and clusters defect are formed by conventional fabrication.

First as FIG. 1A shows, dielectric layer 12 is formed on substrate 10 and is patterned to form a plurality of gaps inside dielectric layer 12. Therefore, conductive layer is formed on dielectric layer 12 and completely fills all of gaps. Then, conductive layer is patterned to form a plurality of conductive structures 14, where each conductive structure 14 completely fills one gap. In addition, possible material of conductive structures 14 comprises polysilicon, silicon and so on. No matter how, in order to form HSG on conductive structures 14 in following process, it is better to be formed conductive structures 14 by polysilicon.

As FIG. 1B shows, HSGs 16 are formed on conductive structures 14 and main function of HSGs 16 is increasing total surface area of conductive structures 14.

Therefore, HSGs 16 and dielectric layer 12 are directly cleaned just when HSGs 16 are formed, clusters 18 are obviously formed on HSGs 16, as FIG. 1C shows. Where material of clusters 18 comprises Si. In addition, cleaning solution of said cleaning process comprises HF and nitric acid.

The disadvantage of clusters 18 can be explained by an example, as FIG. 1D shows. When oxide layer 19 is formed on dielectric layer 12 and totally covers conductive structures 14 and HSGs 16, it is obvious that the interactive area between HSGs 16 and oxide layer 19 is decreased by cluster 18, and then interaction between HSGs 16 and oxide layer 19 is degraded by the cluster defect According to previous discussion, it is obvious that cluster defect is a serious disadvantage in application of HSG and then it is desired to develop a method to overcome the cluster defect.

SUMMARY OF THE INVENTION

The primary object of the present invention is to propose a method capable of preventing the cluster defect of HSG.

A further object of the present invention is to propose a method that efficiently prevents formation of cluster during cleaning process.

In order to accomplish these objects of the invention, a method capable of preventing cluster defect by heat treatment is proposed. The proposed method comprises following steps:

First, forming HSGs on some semiconductor structures, where these semiconductor structures are formed in and on a wafer.

Second, dealing wafer with HSGs by a heat treatment. Where required temperature of heat treatment does not need to be a high temperature, and heat treatment can be provided by rapid thermal process, furnace, and so on.

Third, cleaning wafer with HSGs by cleaning solution. Owing to the fact that HSGs are pre-heated before the cleaning process, no cluster is formed on HSGs and then cluster defect is prevented.

Obviously, the characteristic of the invention is that a heat treatment process is used to treat HSGs before the cleaning process is used to eliminate impurity.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

In order to elucidate these objects of the invention, some figures are employed to illustrate the mechanism and are explained in following paragraphs.

Figure 1A:
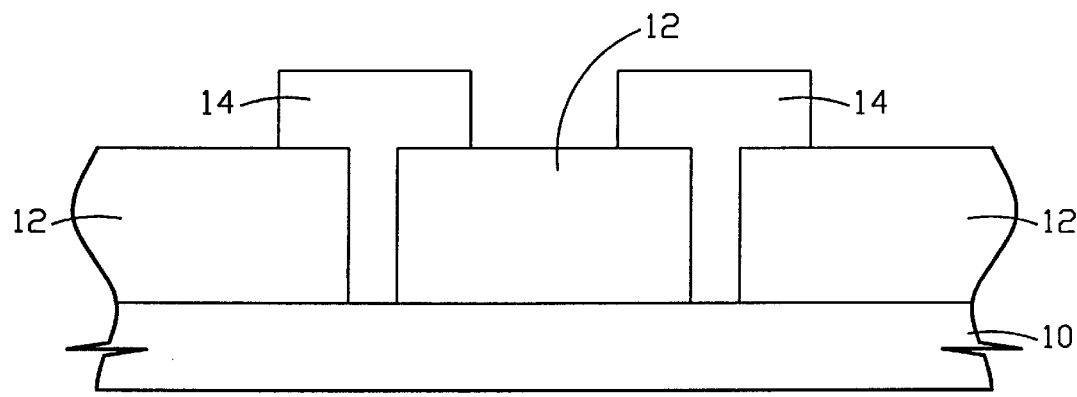
FIG. 1A to FIG. 1C are a series of qualitative cross-sectional illustrations about formation of HSG according to conventional fibrillation.
Figure 1B:
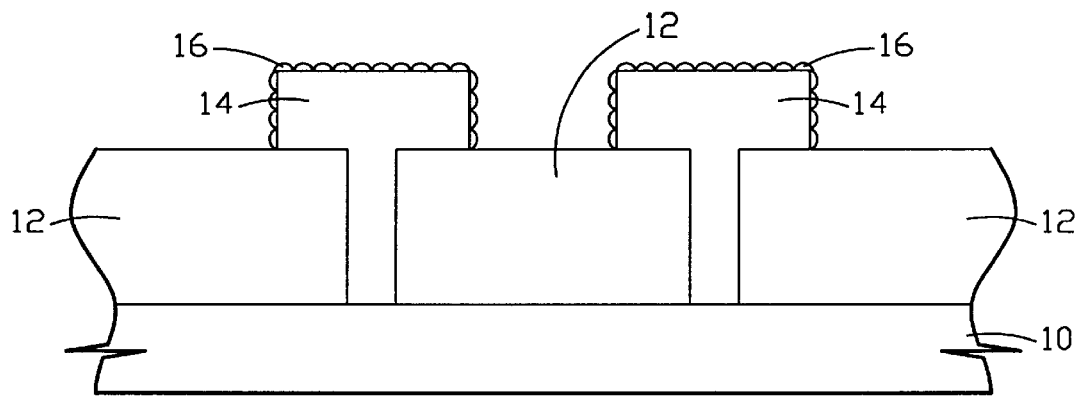
Figure 1C:
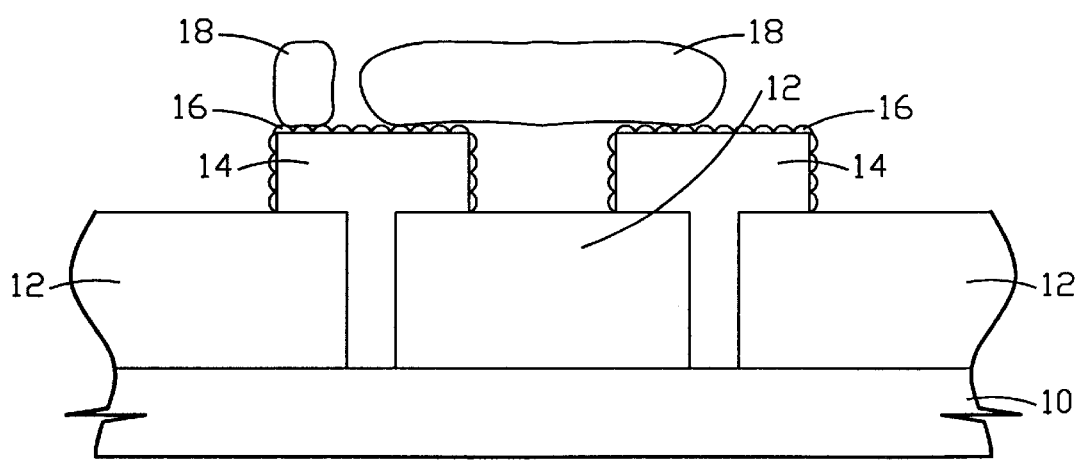
Figure 1D:
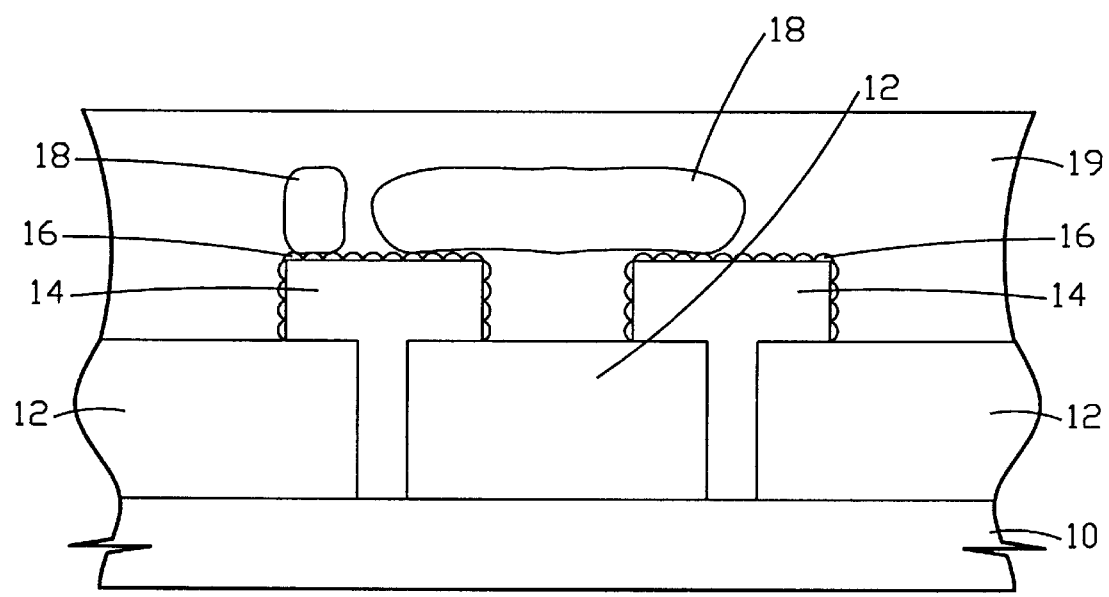
FIG. 1D is a brief cross-sectional illustration to express how cluster defect is appeared in conventional fibrillation
Figure 2A:
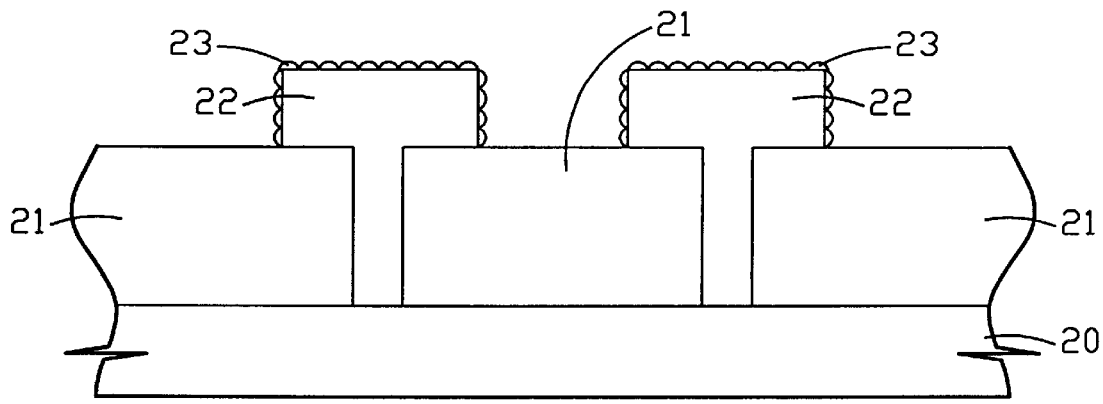
FIG. 2A to FIG. 2C are a series of brief cross-sectional illustrations to express how cluster defect is prevented by the invention.

First, as FIG. 2A shows, substrate 20 is provided and a plurality of elements locate in and on substrate 20, possible class of elements comprises source, drain and well. Then, dielectric layer 21 is formed on substrate 20. Therefore, dielectric layer 21 is patterned and a plurality of gaps are formed inside dielectric layer 21, where each of these gaps directly contacts with substrate 20. And then, conductive layer is formed on dielectric layer 21 and totally fills these gaps. Beside, conductive layer also is patterned to form a plurality of conductive structures 22 where each of these conductive structures 22 completely fills corresponding said gap or corresponding said gaps. Finally, HSGs (more than one HSG) 23 are formed on surface of conductive structures 22.

Moreover, material of dielectric layer 21 comprises oxide and material of conductive layer comprises polysilicon, silicon or metal. No matter how, owing to the fact that HSGs 23 will be formed on part of conductive layer, the most useful material of conductive layer is polysilicon.

Figure 2B:
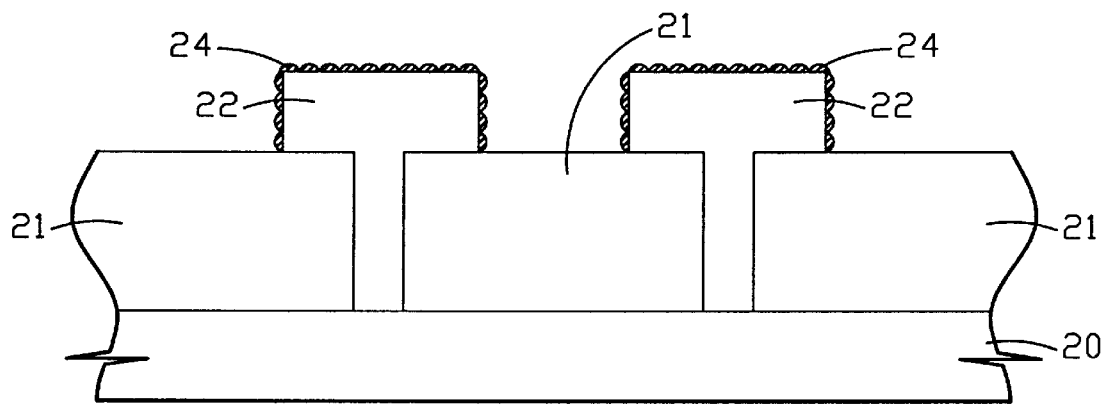

Therefore, before any cleaning process is used to wipe out any impurity on surface of HSGs 23 and surface of dielectric layer 21. The invention employs a heat treatment to treat substrate 20, dielectric layer 21, conductive structures 22 and HSGs 23. As FIG. 2B shows, a significant result of the heat treatment is surface state of HSGs 23 is changed by heating. In other words, HSGs 23 is replaced by improved HSGs 24.

It should be noted that required temperature of the heat treatment is not high and a temperature larger than about 250° C. is enough. Beside, methods to perform the heat treatment comprise rapid thermal process, furnace or UV (ultra-violet)-curing. Moreover, required time of rapid thermal process is about 3 minutes and required time of furnace is about 120 minutes.

Obviously, because temperature of the heat treatment is not high, structures of HSGs 23 (improved HSGs 24) and dielectric layer 21 do not be affected by the heat treatment. Furthermore, owing to the fact that required time of the heat treatment is not long, the decrease amount of throughput that induced by the heat treatment is negligible.

Therefore, cleaning process is used to eliminate any impurity on surface of improved HSGs 24 and surface of dielectric layer 21, where material of cleaning solution of the cleaning process comprises HF and nitric acid.

Figure 2C:
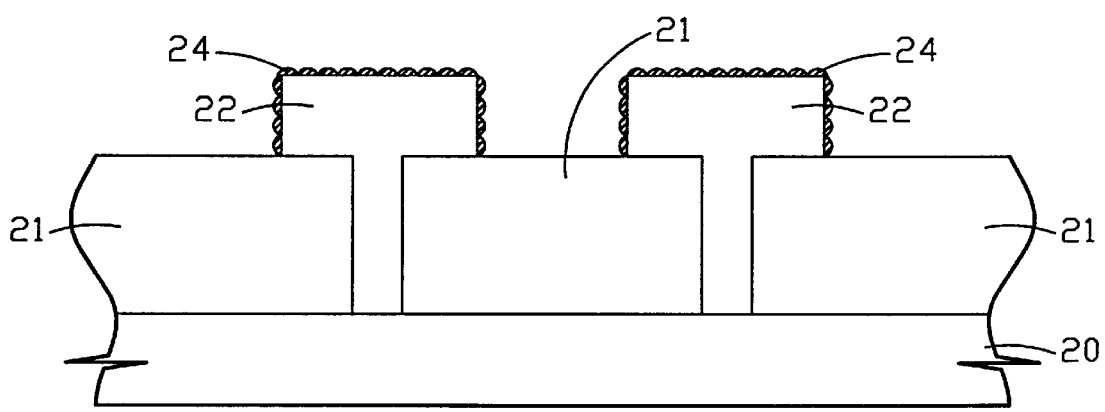

Obviously, as FIG. 2C shows, no cluster is formed on the surface of improved HSGs 24 and surface of dielectric layer 21. In other words, cluster defect is efficiently prevented by the proposed method.

Figure 3:
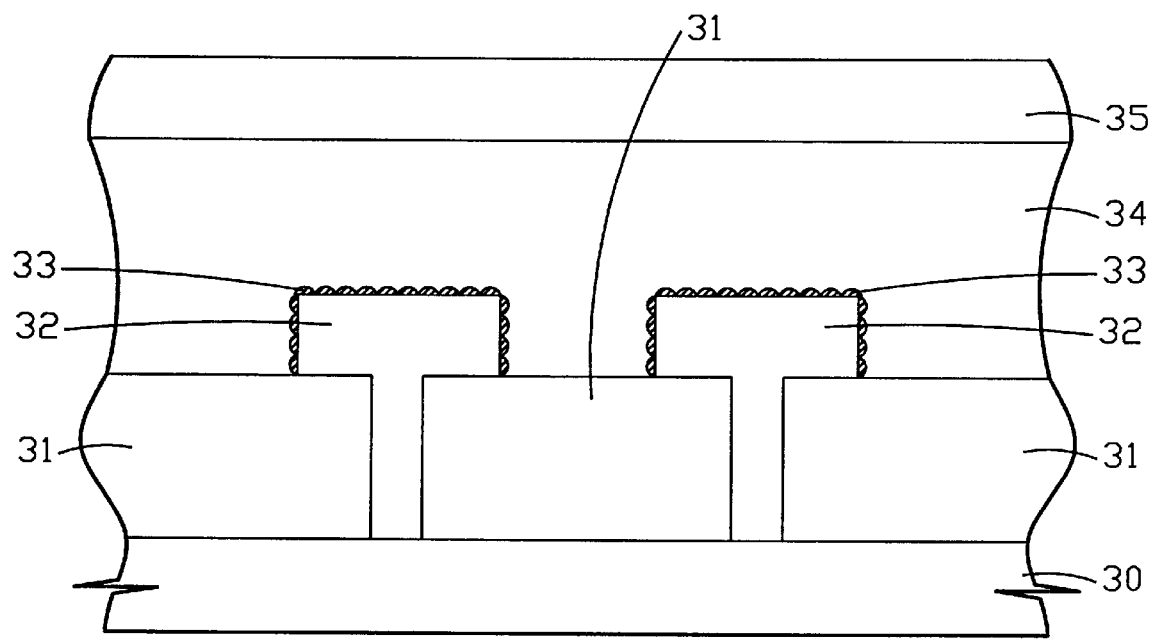
FIG. 3 qualitatively illustrates an embodiment of the present invention that the cluster defect of capacitor is prevented.

FIG. 3 qualitatively illustrates an embodiment of the present invention that how the cluster defect of capacitor is prevented. The embodiment illustrates the most famous application of HSG: increases surface area of electrode of capacitor.

As FIG. 3 illustrates, first dielectric layer 31 is formed on substrate 30 and a plurality of gaps locate inside first dielectric layer 31, where substrate 30 comprises a plurality of elements such as source, drain and conductive line. And material of first dielectric layer 31 comprises oxide. Moreover, each gap corresponds to a paddle-like polysilicon structure 32 and is completely filled by the paddle-like polysilicon structure 32. Furthermore, a plurality of HSGs 33 are formed on surface of all paddle-like polysilicon structures 32. Beside, second dielectric layer 34 totally covers first dielectric layer 31 and paddle-like polysilicon structures 32, wherein possible material of second dielectric layer 34 comprises oxide and ONO composite dielectric tri-layer. Moreover, ONO composite dielectric tri-layer is provided by three adjacent dielectric layers, where the middle layer is SiN layer and the others are oxide layers. Finally, conductive layer 35 is formed on second dielectric layer 34. Of course, the invention furthermore comprises planarization of surface of said second dielectric layer 34 and planarization of surface of said conductive layer 35.

Herein, it should be noted that before formation of second dielectric layer 34, a heat treatment is used to change surface states of HSGs 33, and then a cleaning process is employed to eliminate any impurity on the surface of HSGs 33 and first dielectric layer 30.

Moreover, method of the heat treatment comprises rapid thermal process, furnace or UV-curing. Beside, typical operating temperature of the heat treatment is about larger than 250° C. Additional, required time for rapid thermal process is about 3 minutes and required time for furnace is about 120 minutes. In addition, material of cleaning solution of the cleaning process comprises HF and nitric acid.

Obviously, no cluster exists inside the capacitor that is formed by the invention, therefore, the interaction between HSGs 33 and second dielectric layer 33 does not be degraded by any cluster. Consequently, the cluster defect is efficiently prevented by the proposed invention, and then yield of capacitor is improved.

While this invention has been described in terms of two preferred embodiments, it is to be understood that the invention need not be limited to these disclosed embodiments. Various modification and similar changes are still possible within the spirit of this invention. Thus, the scope of this invention should be defined by the appended claims.

What is claimed is:

1. A method capable of preventing the cluster defect of HSG by heat treatment, said method comprising:
   providing a substrate, said substrate comprises a plurality of elements such as source, drain and well;
   forming a dielectric layer on said substrate;
   patterning said dielectric layer and forming a plurality of gaps inside said dielectric layer, each of said gaps directly contacts with said substrate;
   forming a conductive layer on said dielectric layer and completely filling said gaps;
   patterning said conductive layer and forming a plurality of conductive structures, each of said conductive structures completely filling one of said gaps;
   forming a plurality of HSGs on surface of said conductive structures;
   treating said conductive structures and said HSGs by heat treatment; and
   cleaning surface of said HSGs and said dielectric layer.

2. The method according to claim 1, wherein material of said dielectric layer comprises oxide.

3. The method according to claim 1, wherein material of said conductive layer comprises polysilicon.

4. The method according to claim 1, wherein methods to perform said heat treatment comprise rapid thermal process, furnace or UV-curing.

5. The method according to claim 1, wherein temperature of said heat treatment is larger than about 250° C.

6. The method according to claim 1, wherein time of said rapid thermal process is about 3 minutes.

7. The method according to claim 1, wherein time of said furnace is about 120 minutes.

8. The method according to claim 1, wherein material of solution of said cleaning process comprises HF and nitric acid.

9. A method for improving quality of capacitor by heating HSG before formation of dielectric layer of capacitor, said method comprising:
   providing a substrate;
   forming a first dielectric layer on said substrate;
   patterning said first dielectric layer and forming a plurality of gaps inside said first dielectric layer, each of said gaps directly contacting with said substrate;
   forming a polysilicon layer on said first dielectric layer and completely filling said gaps;
   patterning said polysilicon layer and forming a plurality of paddle-like polysilicon structures, each of said paddle-like polysilicon structures completely filling one of said gaps;
   forming a plurality of HSGs on surface of said paddle-like polysilicon structures;
   treating said paddle-like polysilicon structures and said HSGs by heat treatment, wherein temperature of said heat treatment is larger than about 250° C.;

cleaning surface of said HSGs and said first dielectric layer;

forming a second dielectric layer on said first dielectric layer, said second dielectric layer completely covering said paddle-like polysilicon structures; and forming a conductive layer on said second dielectric layer.

10. The method according to claim 9, wherein material of said first dielectric layer comprises oxide.

11. The method according to claim 9, wherein method of said heat treatment comprises rapid thermal process, furnace or UV-curing.

12. The method according to claim 9, wherein time of said rapid thermal process is about 3 minutes.

13. The method according to claim 9, wherein time of said furnace is about 120 minutes.

14. The method according to claim 9, wherein material of cleaning solution of said cleaning process comprises HF and nitric acid.

15. The method according to claim 9, wherein material of said second dielectric layer comprises oxide and ONO composite dielectric tri-layer.

16. The method according to claim 9, wherein said ONO composite dielectric tri-layer is provided by three adjacent dielectric layers, where the middle layer is SiN layer and the others are oxide layers.

17. The method according to claim 9, furthermore comprises planarization of surface of said second dielectric layer.

18. The method according to claim 9, furthermore comprises planarization of surface of said conductive layer.

19. A method capable of preventing the cluster defect of HSG by heat treatment, said method comprising:

providing a substrate, said substrate comprising a plurality of elements such as source, drain and well;

forming a dielectric layer on said substrate;

patterning said dielectric layer and forming a plurality of gaps inside said dielectric layer, each of said gaps directly contacts with said substrate;

forming a conductive layer on said dielectric layer and completely filling said gaps;

patterning said conductive layer and forming a plurality of conductive structures, each of said conductive structures completely filling one of said gaps;

forming a plurality of HSGs on surface of said conductive structures;

treating said conductive structures and said HSGs by a heat treatment, where typical temperature of said heat treatment is about larger than 250° C.; and cleaning surface of said HSGs and said dielectric layer.

* * * * *